United States Patent [19]
Krone et al.

[11] Patent Number: 6,064,326
[45] Date of Patent: May 16, 2000

[54] ANALOG-TO-DIGITAL CONVERSION OVERLOAD DETECTION AND SUPPRESSION

[75] Inventors: Andrew W. Krone; Navdeep S. Sooch, both of Austin, Tex.

[73] Assignee: Silicon Laboratories, Inc., Austin, Tex.

[21] Appl. No.: 09/050,316

[22] Filed: Mar. 30, 1998

[51] Int. Cl.$^7$ .............................. H03M 3/00; H03M 1/06
[52] U.S. Cl. ........................................... 341/143; 341/118
[58] Field of Search ................................. 341/118, 143, 341/166, 122, 77, 139, 131, 120; 327/341

[56] References Cited

U.S. PATENT DOCUMENTS

| | | | |
|---|---|---|---|
| 3,596,267 | 7/1971 | Goodman | 341/77 |
| 3,654,560 | 4/1972 | Cath et al. | 341/118 X |
| 3,784,922 | 1/1974 | Blahut | 341/143 |
| 4,720,688 | 1/1988 | Hasegawa et al. | |
| 4,851,841 | 7/1989 | Sooch. | |
| 4,876,544 | 10/1989 | Kuraishi | 341/166 |
| 4,888,587 | 12/1989 | Kuraishi | 341/122 |
| 4,980,899 | 12/1990 | Troost et al. | |
| 5,012,244 | 4/1991 | Wellard et al. | |
| 5,272,451 | 12/1993 | Yamate et al. | |
| 5,376,834 | 12/1994 | Carobolante. | |
| 5,384,808 | 1/1995 | Van Brunt et al. | |
| 5,644,257 | 7/1997 | Kerth et al. | |
| 5,654,984 | 8/1997 | Hershbarger et al. | |
| 5,689,206 | 11/1997 | Schaller. | |
| 5,736,895 | 4/1998 | Yu et al. | |
| 5,856,766 | 1/1999 | Gillig et al. | |
| 5,870,046 | 2/1999 | Scott et al. | 341/143 |
| 5,907,299 | 5/1999 | Green et al. | 341/143 |

OTHER PUBLICATIONS

James C. Candy and Gabor C. Temes, "Oversampling Methods for A/D and D/A Conversion," IEEE Press, ISBN 0–87942–285–8, 1992, pp. 1–25.

D.R. Welland, B.P. Del Signore, and E.J. Swanson, and T. Tanaka, K. Hamashita, S. Hara, and K. Takasuka, "A Stereo 16–Bit Delta–Sigma A/D Converter for Digital Audio", Journal of the Audio Engineering Society, vol. 37, Jun. 1989, pp. 476–486.

Kirk C.–H. Chao, Shujaat Nadeem, Wai L. Lee and Charles G. Sodini, "A Higher Order Topology for Interpolative Modulators for Oversampling A/D Converters", IEEE Trans. Circuits and Sys., vol. CAS–37, Mar. 1990, pp. 309–318.

James C. Candy, "A Use of Double Integration in Sigma Delta Modulation", IEEE Trans. Commun., vol. COM–33, Mar. 1985, pp. 249–258.

Paul R. Gray and Rinaldo Castello, "Chapter 10–Performance Limitations in Switched–Capacitor Filters", Design of MOS VLSI Circuits for Telecommunications–1985 Prentice–Hall, Englewood Cliffs, NY 07632, ISBN: 0–13–200643–X, pp. 314–333.

Adel S. Sedra, "Chapter 9–Switched–Capacitor Filter Synthesis", Design of MOS VLSI Circuits for Telecommunications–1985 Prentice–Hall, Inc., Englewood Cliffs, NJ 07632, ISBN: 0–13–200643–X, pp. 272–313.

*Primary Examiner*—Brian Young
*Assistant Examiner*—Patrick Wamsley
*Attorney, Agent, or Firm*—Davis & Johnson, LLP

[57] ABSTRACT

A technique for detecting and suppressing overload conditions in an analog-to-digital converter which uses a delta-sigma modulator. In order to prevent overloading in modulator, a detection unit is used to detect a preset amplitude level associated with an input signal and when such level is detected, the performance of the modulator is degraded in order to prevent the overload condition from occurring. The degrading is achieved by changing the coefficients of operation of the integrator(s) in the modulator.

30 Claims, 6 Drawing Sheets

ANALOG-TO-DIGITAL CONVERSION OVERLOAD DETECTION AND SUPPRESSION

BACKGROUND OF THE INVENTION

1. Field of the Invention

The present invention relates to the field of analog-to-digital conversion and, more particularly, to a technique for detecting and suppressing overload conditions in a delta-sigma analog-to-digital converter.

2. Background of the Related Art

The general technique of providing analog-to-digital (A/D) or digital-to-analog (D/A) conversion of signals is well known in the art. Generally, the sampling rate required to sample an analog signal for A/D conversion must be twice the highest frequency component being sampled. This rate is known as the Nyquist rate. More recently, oversampling methods have been utilized for A/D and D/A conversion. In an oversampling type of converter, the sampling rate is much higher than the Nyquist rate. An oversampling technique is described in a reference titled "Oversampling Methods for A/D and D/A Conversion;" by James C. Candy and Gabor C. Temes; IEEE; pp. 1–25; 1992.

An advantage of using the oversampling technique is in the precision provided by the converter. With converters operating under the Nyquist rate for sampling, a certain amount of precision is required for the conversion. For example, in converting an analog signal into a 16-bit digital format, 16-bit precision is required. Accordingly, circuits will need to be designed having components which will meet this precision. In many instances, closely trimmed circuit components or precision matching (or compensating) circuits are required to meet the precision.

However, when sampling at a rate much higher than the required Nyquist sampling rate, the oversampling technique permits circuit precision to be relaxed significantly. For example, if the above A/D 16-bit oversampling converter implements an oversampling modulator, the modulator output can be a single bit output. The circuit precision needs only to meet this 1-bit output. Accordingly, closely trimmed circuit components are generally not needed. Additionally, 1-bit precision can be readily met by current generation CMOS (complementary-metal-oxide-semiconductor) components.

The disadvantage in using the oversampling technique is the added requirement that the output now needs to be reduced to the standard Nyquist rate at the eventual output of the converter. That is, the higher sampling rate now needs to be returned to the Nyquist rate. In the above 16-bit example, a multiple number of the 1-bit outputs will need to be combined to form a single 16-bit output, which output is equivalent to the 16-bit output from the Nyquist rate converter. However, the oversampling technique is preferred in many applications, since the cost savings in using less precise circuit components outweigh the additional digital signal processing needed at the back end of the converter.

One well known type of oversampling A/D conversion uses a modulator commonly referred to as a delta-sigma modulator. In a A/D converter (ADC) using a delta-sigma modulator, an integrator and a comparator are utilized at the front end of the converter to provide the quantization of the analog signal. Then, a low-pass filter and a decimator are utilized for digital signal processing to provide a corresponding digital signal at the Nyquist rate. However, the circuit precision of the analog circuitry can be relaxed, due to the use of the higher sampling rate. It is also the practice to design the delta-sigma modulators for higher than the first order of operation. Higher order delta-sigma modulators are desirable, since lower sampling rates can be utilized to obtain the same precision as operating the modulator at a lower order but with higher sampling rates. See for example, "A Stereo 16-Bit Delta-Sigma A/D Converter for Digital Audio;" by D. R. Welland et al.; Journal of the Audio Engineering Society, vol. 37, pp. 476–486; June 1989; and "A Higher Order Topology for Interpolative Modulators for Oversampling A/D Converters;" by Kirk C. H. Chao et al.; IEEE Trans. Circuits and Sys., vol. CAS-37, pp. 309–318; March 1990.

For proper modulator operation, it is desirable for the modulator to respond linearly to the input signal amplitude. However, it is also known that modulators can experience distortion near the peak amplitude levels of the input signal. This is especially true, if the full-scale digital output signal is equivalent to the full-scale analog input signal. Ideally, the clipping action of the digital decimation filter should occur at the peak modulator input signal amplitude, so that any distortion at the output is limited to a range of voltages beyond the specified maximum amplitude of the input signal. In reality, the overload point, where the modulator performance degrades suddenly, can vary from the desired operating point due to various circuit tolerances and ambient factors. That is, the sudden overload action may commence to occur prior to the peak input signal level, which limits the performance of the modulator.

In order to address the occurrence of such an overload condition in a delta-sigma modulator, one scheme utilizes a gain scaling technique to adjust the gain of the modulator stage. See for example, U.S. Pat. No. 4,851,841. In this technique, the gain of the modulator is scaled to provide an effective feedback reference voltage that has a value greater than the specified maximum input voltage and the gain is readjusted at the decimation filter.

It is to be noted that the overload condition is different than an unstable condition. In an overload condition, the modulator experiences a degraded signal-to-noise ratio when the input amplitude exceeds a certain value, but the modulator can recover when the overload condition is removed, typically by the reduction of the signal amplitude. Instability is also a function of the amplitude of the input signal, but in this instance (unlike the overload condition), the modulator generally cannot recover from an unstable behavior with the reduction of the input signal. The recovery is usually achieved by resetting the modulator.

The present invention is a different scheme to address the overload condition, in which the distortions encountered near peak input signal amplitude levels are compensated.

SUMMARY OF THE INVENTION

The present invention describes a technique for detecting and suppressing an overload condition in an analog-to-digital converter utilizing a delta-sigma modulator. A delta-sigma modulator can experience an overload condition as an analog input signal approaches full scale (or peak amplitude). Even when properly designed to prevent such overloading conditions from occurring, circuit tolerances and parameters can vary, causing the modulator to experience reduced signal-to-noise when the input signal approaches peak amplitude. In order to prevent this overloading condition from occurring, the present invention degrades the performance of the delta-sigma modulator as the analog signal approaches full scale input.

In the preferred embodiment, a detection unit is coupled to the output of the delta-sigma modulator to detect when the input signal exceeds a certain amplitude. The detection unit generates a signal to switch in circuit components which degrade the performance of the modulator. The degradation is achieved by changing the coefficient of one or more of the integrator(s) of the delta-sigma modulator. In the preferred technique, a different capacitance value is inserted in a switched capacitor circuit associated with the integrator stage(s) being degraded. In some instances this degradation causes the modulator to behave as though it is operating as a lower-order modulator. The degraded performance ensures that the modulator will be more stable as the input signal amplitude approaches full scale.

DETAILED DESCRIPTION OF THE INVENTION

A technique for detecting and suppressing overload conditions in an analog-to-digital converter is described. In the following description, numerous specific details are set forth, such as specific structures, materials, processes, etc., in order to provide a thorough understanding of the present invention. However, it will be appreciated by one skilled in the art that the present invention may be practiced without these specific details. In other instances, well known techniques and structures have not been described in detail in order not to obscure the present invention. It is to be noted that a preferred embodiment of the present invention is described in reference to a switched capacitor delta-sigma ($\Delta\Sigma$) modulator. However, it is appreciated that the invention can be readily implemented to suppress overload conditions in other types of modulators as well, without departing from the spirit and scope of the present invention.

Figure 1:
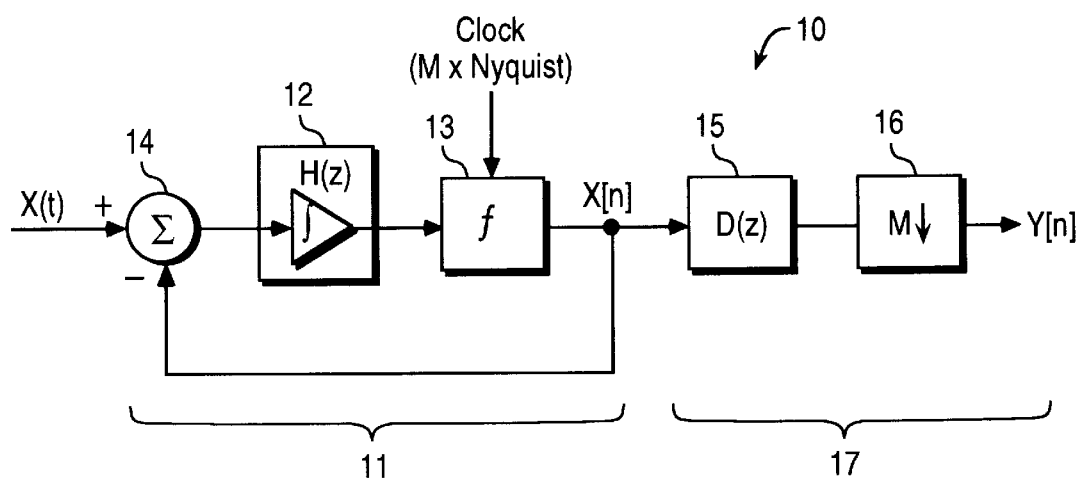
FIG. 1 is a block diagram of a prior art analog-to-digital converter using a delta-sigma modulator.

Referring to FIG. 1, a prior art analog-to-digital converter (A/D converter or ADC) 10 is illustrated. ADC 10 is of an oversampling type of converter utilizing a delta-sigma modulator 11 at the front end of the ADC 10. The delta-sigma modulator 11 is comprised of an integrator 12 and a comparator 13. An analog input signal x(t) is coupled as an input to the integrator 12 through a summing node or junction 14 (also referred to as a summer). The integrator provides an integrated output to the comparator 13. The comparator 13 is clocked at a sampling frequency which is M times the normal Nyquist rate, thereby providing the oversampling rate required of modulator 11. The output of the comparator 13 is a quantization signal x[n] which is coupled back in a feedback loop to the summing node 14 to subtract from the input signal at the input of the integrator 12. The operation of a delta-sigma modulator is well known and described in the references noted in the Background section above.

The back end of the ADC 10 is comprised of a decimation filter 17. The decimation filter 17 is typically comprised of a low-pass filter 15 (shown having function D(z)) and a decimator 16. The low-pass filter 15 passes the quantized signal but filters out the higher frequency quantization noise. The decimator 16 reduces the sample rate of the output signal from the digital low-pass filter 15 to provide the output y[n]. Again, the decimation technique is well known and described in the above-noted references.

Figure 2:
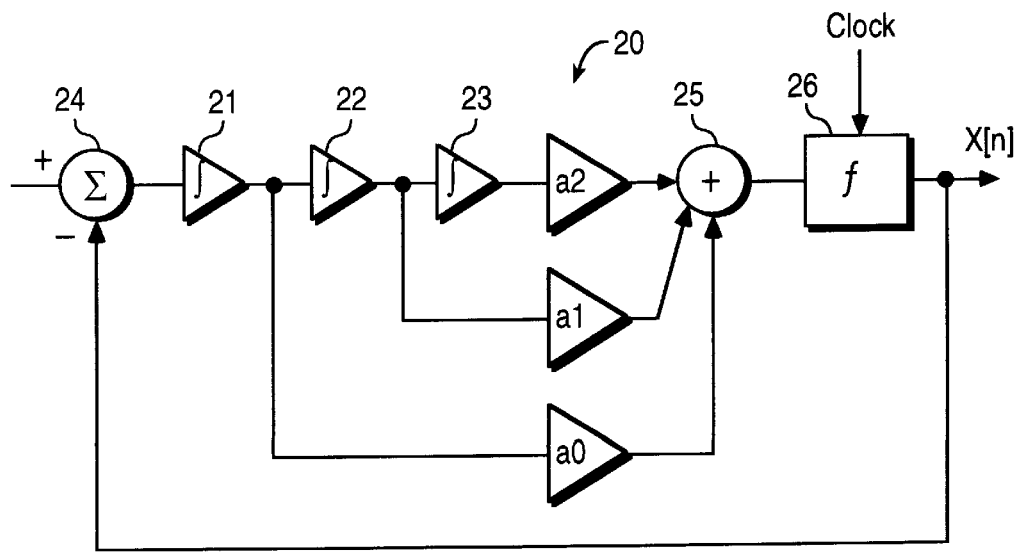
FIG. 2 is a block diagram of a third-order delta-sigma modulator showing the coefficients which relate to each of the three integrator stages.

FIG. 2 shows a delta-sigma modulator 20 which functions equivalent to the modulator 11 of FIG. 1. Whereas modulator 11 was of the first order, the delta-sigma modulator 20 is a higher order modulator. Specifically, it is a third order modulator, since it has three integrator stages in the loop. Accordingly, after an input summing node 24, three integrators 21–23 are coupled serially so that the output of each integrator is coupled as an input to the next integration stage. The output of each of the integrators 21–23 is referred to as a state variable and the outputs are coupled to a summing node 25 for summing the signals at the input of a comparator 26, which is clocked at the oversampling rate to quantize the signal. The operation of a higher order delta-sigma modulator is known in the art. See for example, "A use of Double Integration in Sigma Delta Modulation;" by James C. Candy, IEEE Trans. Commun., vol. COM-33, pp. 249–258, March 1985, as well as U.S. Pat. No. 5,012,244.

Each state variable can be scaled by the use of a multiplier, which is referred to as a coefficient. As noted in FIG. 2, each output of the integrators 21–23 feeds forward to the summing node 25 and has a respective coefficient noted as $a_0$, $a_1$ or $a_2$. The locations of the poles and zeros of the closed loop system determines the operating characteristic or behavior of the modulator.

As described earlier in the Background section, the delta-sigma modulators can experience an overload condition at or near peak input signal amplitude. The overload condition is typically noted by a sudden degradation in the signal-to-noise response. That is, substantial amount of noise is noted in the output when the overload condition occurs. Although the overload condition can be removed by reducing the amplitude of the input signal, it is desirable that such conditions do not occur at full input signal amplitude. An example of an undesirable effect of an overload condition is illustrated in FIG. 3.

Figure 3:
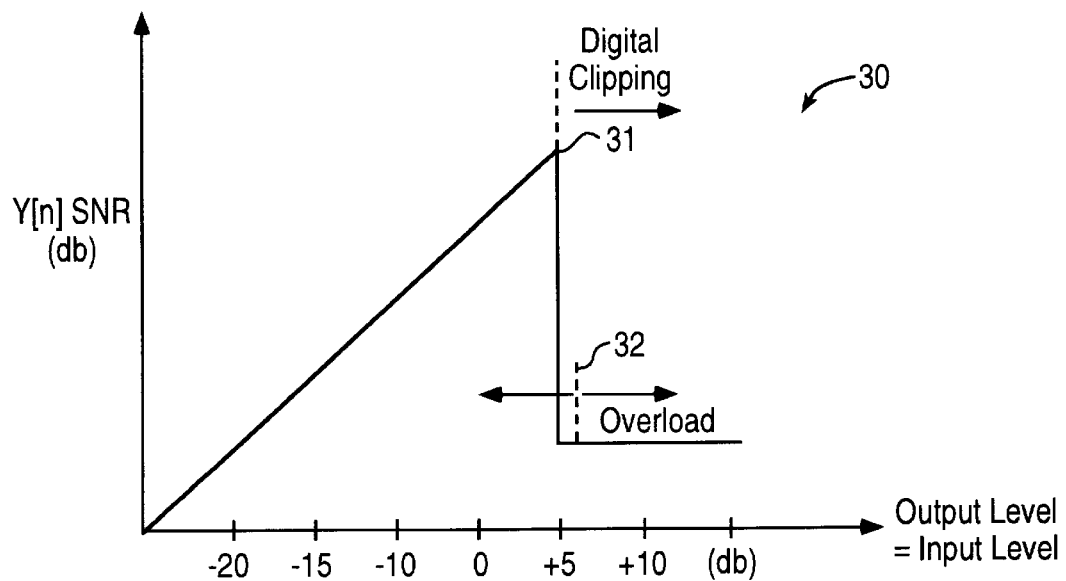
FIG. 3 is a graphic representation of a prior art modulator system showing the response of an output signal-to-noise ratio to the amplitude of the output signal when the output level equals the input level.

Referring to FIG. 3, a modulator response curve 30 is shown comparing the signal-to-noise ratio (SNR) of an output to an output signal level when the output level equals the input level. That is, curve 30 shows the SNR of the output signal when there is a one-to-one relationship between the input and output, so that full-scale analog input equals full-scale digital output. In the ideal situation, clipping of the output should occur at the peak amplitude of the input signal (noted as 0 db in FIG. 3). Accordingly, the maximum SNR is obtained at point 31, which is 0 db. At or beyond this point, the SNR drops suddenly to a lower value, due to the clipping effect of the digital decimation filter. Additionally, the overload point of the modulator occurs at an input level slightly larger than 0 db and is noted as point 32.

As noted in FIG. 3, in an ideal situation the overload point 32 should reside at or above point 31 so that the modulator performance is not degraded, until the maximum specified analog signal input is exceeded. However, in actual practice, as H(z) varies from the intended design value (which will likely occur with component, manufacturing or ambient variations), the overload commencement point 32 will shift from its intended location (as shown in the Figure). If the point 32 shifts below 0 db in the example (the point of maximum SNR), overloading will commence in the operative range of the input signal. In order to compensate for this fluctuation of the overloading point 32, one prior art technique is to design maximum output signal amplitude at less than the typical modulator full scale value through gain scaling techniques. See for example, U.S. Pat. No. 4,851,841.

It is also to be appreciated that the curve 30 illustrates a steep drop off at the maximum SNR point 31. This implies that once the maximum SNR is reached at full scale input, a slight increase in the input signal will result in a significant SNR performance degradation at the output. Accordingly, in order to avoid this sudden SNR performance drop, systems are again designed so that modulators operate at less than full scale.

The present invention provides for a scheme in which an overload condition is detected and then suppressed so that overload at or near full scale analog input is controlled. The scheme of the invention is to degrade the performance of one or more integrator(s) when a certain input amplitude level is reached, so that the modulator system is degraded to reduce the likelihood of the system from entering into an overload condition. This is illustrated in the graph 40 of FIG. 4.

Figure 4:
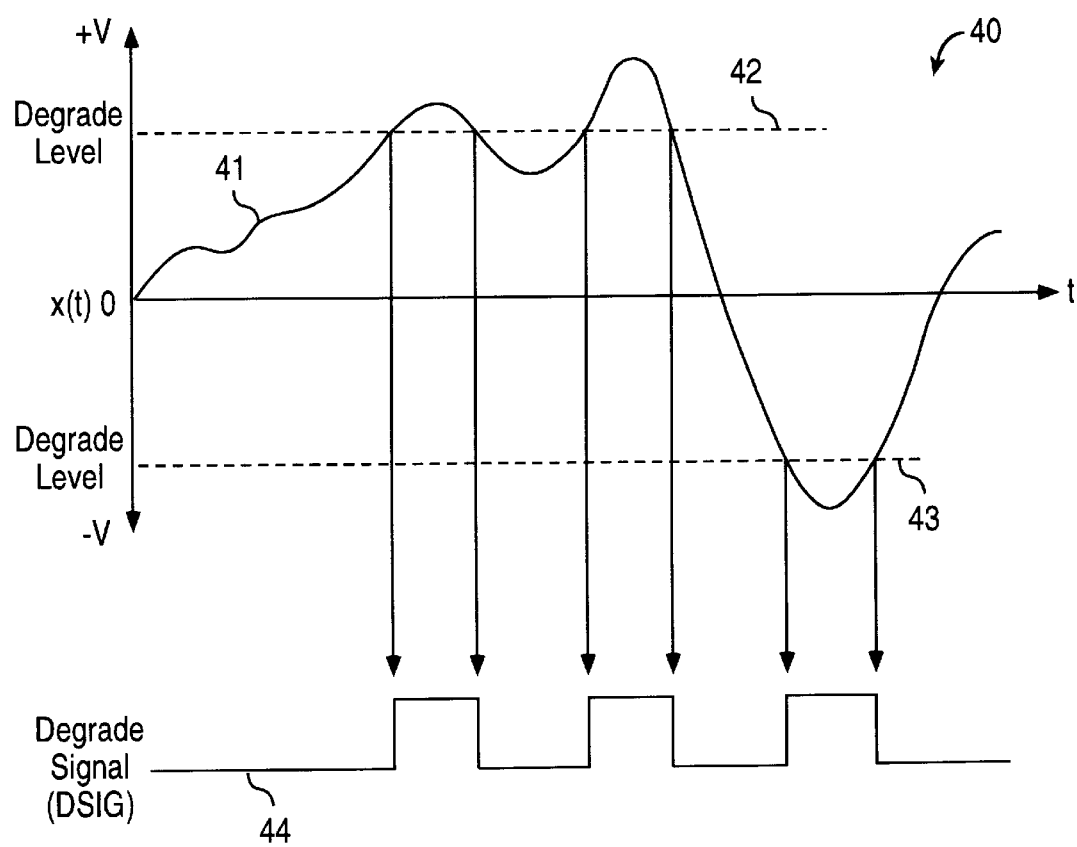
FIG. 4 is a waveform representation showing an initiation of a degrading mode of the present invention.

In FIG. 4, an analog input signal 41 is shown having both positive and negative cycles. A positive degradation threshold level 42 and a negative degradation threshold level 43 are set for the input signal 41. The degradation levels 42, 43 are chosen so that when the magnitude of the input signal exceeds this level, a degradation condition will be initiated. As noted in FIG. 4, a degradation signal (DSIG) 44 is generated, in which the signal 44 corresponds to the time period when the input signal 42 exceeds the positive or negative threshold levels. In the example, DSIG 44 is a digital signal which is at a high state when the input signal magnitude is above the degradation threshold levels 42, 43.

Figure 5:
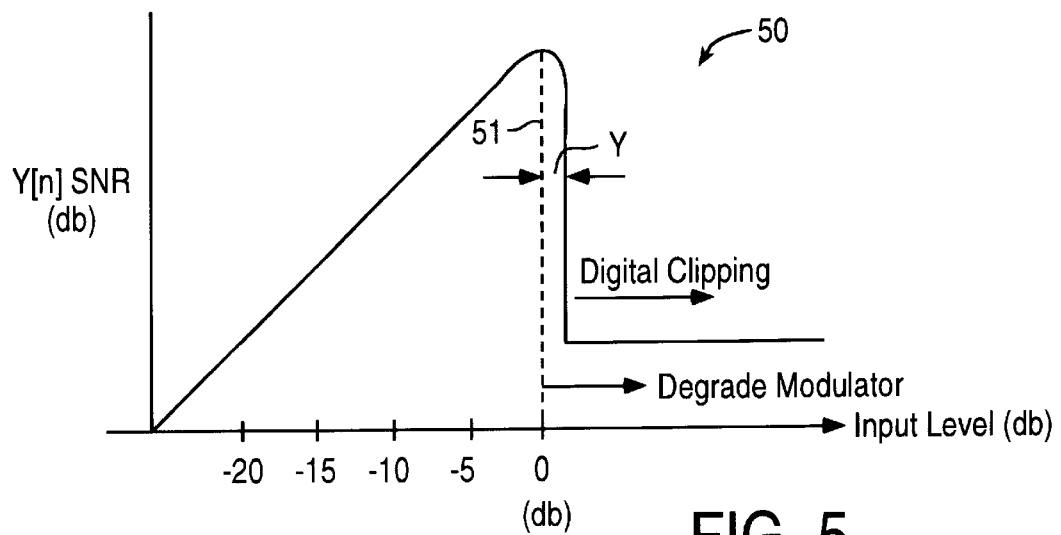
FIG. 5 is a graphic representation of a modulator system of the present invention, showing the response of an output signal-to-noise ratio to the amplitude of the input signal when the degrading mode of the present invention is used.

The degradation signal 44 is then utilized to activate the degradation mode of the modulator, in which the modulator performance is degraded. The degrading of the modulator performance can be designed to degrade the performance without changing the mode of operation or it can force the modulator to behave as though it is operating as a lower-order modulator. Degrading of a delta-sigma modulator performance allows the modulator to behave in a manner that is less susceptible to an overload when the input signal approaches full scale input (peak amplitude), FIG. 5 shows a curve 50, which is an improvement over the curve 30 of FIG. 3. Curve 50 illustrates the resulting application of the present invention. As was noted in FIG. 3, the peak amplitude of the input signal is designated 0 db. A degradation point 51, which activates a degradation mode for the modulator, is set at the threshold levels noted in FIG. 4. This point 51 can be set at full scale input or less than full scale input. In the preferred technique, the commencement of the degradation mode is set at the full scale input value of 0 db. That is, the threshold levels 42, 43 shown in FIG. 4 are set at the maximum amplitude point of the specified analog input, which is specified as full scale for the modulator. Thus, the peak point of the SNR curve is at the 0 db degradation initiation point. Again, as noted above, this point 51 can be set at less than the 0 db value in an alternative design.

The modulator is designed so that once this degradation point 51 is reached, the performance of the modulator is degraded. The degrading is achieved by operating the modulator in a mode which reduces the SNR. As shown in curve 50, instead of a sudden change in the SNR at 0 db input, the SNR gradually declines until the modulator enters the clipping mode at some point above 0 db input. The modulator performance is effectively degraded at 0 db so that a sudden onset of the clipping at the output is suppressed until a value of 0+Y db is reached. The Y value is determined by the amount of degrading implemented. Therefore, the range for Y determines the degraded performance region for the modulator. Since the delta-sigma modulators utilized for ADC typically operate as higher order modulators, this degraded performance is analogous to the modulator operating somewhat like a lower order modulator.

It is appreciated that since the full scale analog input can be exceeded without severe clipping being experienced at the output, the design specifications allow for the input to exceed full scale to obtain a full scale output. Furthermore, since there is a gentle roll-off at the peak of the SNR, a sudden or abrupt transition into the clipping mode is avoided. In analogy, the behavior of the curve 50 is analogous to a behavior of an analog circuit transitioning from a linear mode to a non-linear mode and then to a clipping mode. By forcing the modulator to operate at a reduced performance level, the overload condition is suppressed until some higher input signal level is reached. Thus, even with variations in the modulator circuitry, the likelihood of the modulator entering an overload condition at or below peak input amplitude is suppressed or minimized.

Figure 6:
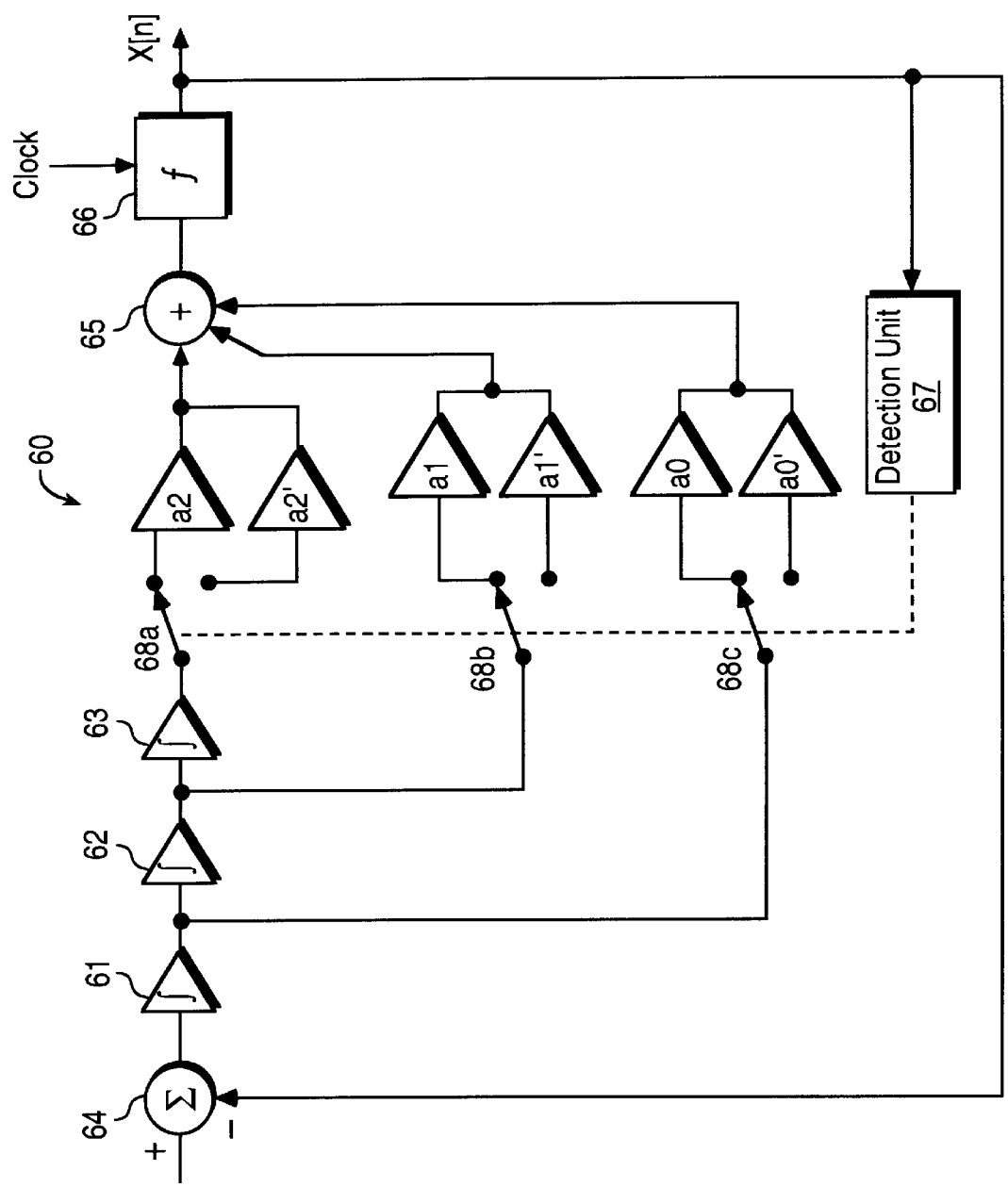
FIG. 6 is a block diagram of a third-order delta-sigma modulator system which incorporates the present invention in which a detection unit is used to switch in a different set of coefficients to initiate the degrade mode of the present invention.

A number of techniques can be implemented to provide the degrading operation of the modulator. One technique is illustrated in FIG. 6. In FIG. 6, a delta-sigma modulator 60 is shown. Modulator 60 is a third-order modulator when operating in its normal mode. A third-order modulator is exemplified in the Figure, since it is a typical practice to utilize third-order (or higher) sigma-delta modulator for oversampling type ADCs. Accordingly, modulator 60 is shown having three stages of integrators 61–63 and is equivalent to the third-order modulator 20 shown in FIG. 2. It is to be noted that the present invention can be implemented in modulators of the first or second order, if such a modulator is used in the ADC. Summation networks 64 and 65 and comparator 66 also function equivalently to respective counterparts of FIG. 2.

The modulator 60 incorporates an overload detection unit 67 coupled in the feedback loop. The quantized signal x[n] is coupled as an input to detection unit 67. The detection unit 67 is used to monitor the signal x[n] and detect a condition associated at the output which corresponds to a certain input amplitude. In the example of the preferred embodiment, the output signal corresponding to full scale at the input is selected as the trigger point for activating the degrading mode of operation for the modulator. That is, in the example, an output value corresponding to 0 db at the input is set to generate the signal DSIG. When the input exceeds this degradation threshold, the detection unit generates the signal DSIG. This signal is then utilized to control the behavior of the integrators so that one or more of the integrators change its/their mode of operation so that the overall performance is degraded in accordance with the graphed example of FIG. 5.

Figure 7:
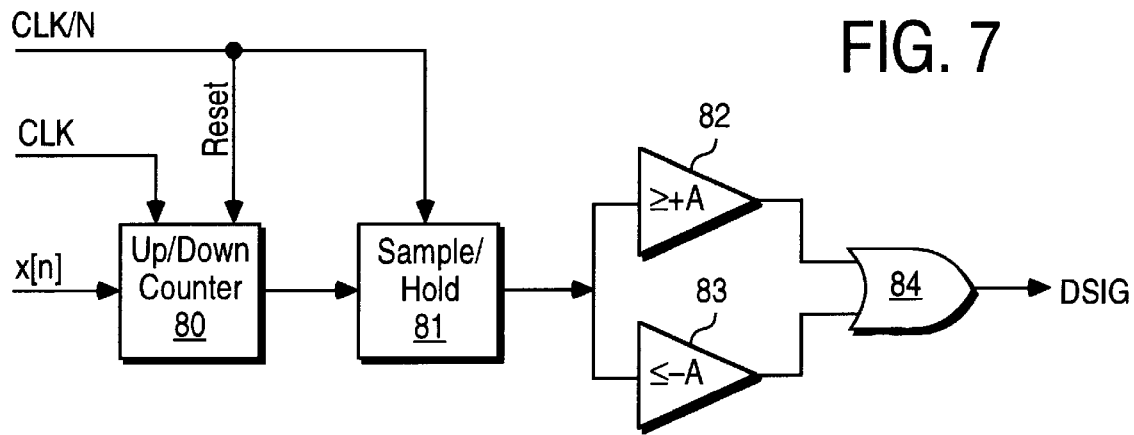
FIG. 7 is a block diagram of the detection unit of the preferred embodiment.

Although a variety of detection circuitry can be utilized for the detection unit 67, one implementation is shown in FIG. 7. The detection unit of FIG. 7 is comprised of an up/down counter 80, sample and hold circuit 81, comparators 82 and 83. The counter 80 counts the bit stream x[n] by counting up when of one value and counting down when of the other value (for example, values of +1 and −1). The counter is reset every N counts. The sample/hold circuit 81 accumulates the output of the counter, which accumulation is an indication of the amplitude of the signal being measured. At each N count, the accumulated value is outputted to the comparators 82, 83. One comparator determines if the positive threshold level for activating the degrading mode is exceeded, while the other comparator checks for negative threshold level. An OR gate 84 is coupled to the output of the comparators for generating the DSIG signal, if the magnitude for initiating DSIG is reached during each counting cycle.

In the circuit shown in FIG. 6, the detection unit 67 activates the degrading function of the modulator by switching in a separate set of circuit components to change the coefficients of one or more of the integrators 61-63. As shown, feed forward paths from the output of the integrators 61-63 are coupled through respective switches 68a–c. The DSIG signal from the detection unit 67 controls the operation of the switches 68a–c, so that different coefficients are inserted for one or more of the integrators 61–63.

Accordingly, when in normal mode of operation, the integrators 61–63 operate with circuit parameters providing the coefficients $a_0$, $a_1$ and $a_2$. When the input signal magnitude rises above the degrade level (0 db at the input for the example), the detection unit 67 count threshold is exceeded and causes circuit parameters associated with the coefficients $a_0'$, $a_1'$ and $a_2'$ to be used. These coefficients cause the modulator to operate in the degraded mode of performance.

It is appreciated that not all of the coefficients need to be changed for the modulator to operate in the degraded mode. For example, in one technique, the coefficients are set to have the following values:

$a_0=1$, $a_1=2/7$, $a_2=2/84$ and $a_0'=1$, $a_1'=2/7$, $a_2'=1/84$

In this particular example, only one coefficient value is changed. In the normal mode the coefficient $a_2$ has a value of 2/84 and in the degraded mode the coefficient has the value 1/84. This slight difference causes the third-order modulator shown in FIG. 6 to operate more like a second-order modulator, due to the noise shaping characteristic which appears more like a second-order system than a third-order system and in which the SNR is reduced. It is appreciated that the values noted above are presented as an example and other equivalent means can be designed to suppress the overload condition, without departing from the spirit and scope of the present invention.

Figure 8:
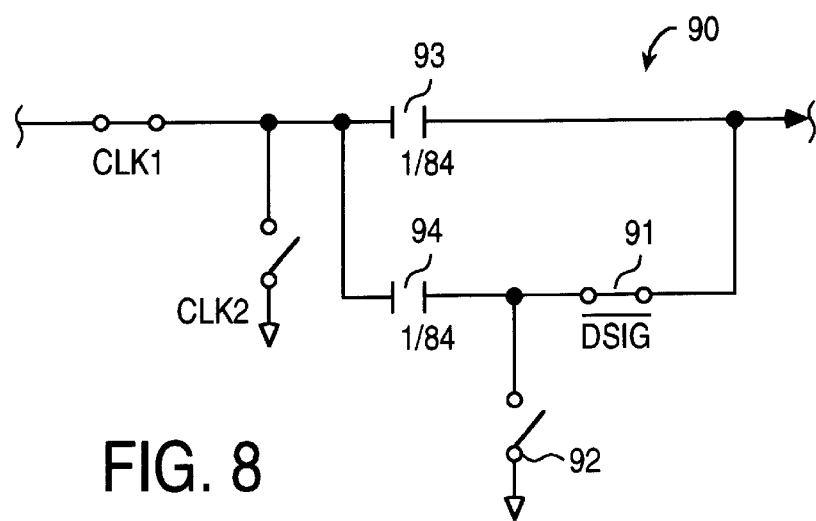
FIG. 8 is a circuit diagram showing the operation of a switched capacitor circuit for switching in a new coefficient at one of the integrator stages of the modulator when a degrading mode is activated.

Also referring to FIG. 8, one example of coefficient switching for a modulator using a switched capacitor circuitry is shown. In the example, circuit 90 provides for one pair of coefficient switching. Thus, for the above example, circuit 90 provides the coefficient switching between $a_2$ and $a_2'$. When the modulator is operating normally (non-degraded mode), switch 91 is closed placing the two capacitors 93 and 94 in parallel. The coefficient value is set at 2/84 (1/84=1/84). When the degrading mode is activated by DSIG, switch 91 opens and switch 92 closes, effectively removing capacitor 94 from the circuit. Only capacitor 93 remains, providing the coefficient value of 1/84. It is appreciated that other schemes can be readily implemented to provide the coefficient switching operation for degrading the performance of the modulator.

It is also appreciated that there are a number of ways the present invention can be implemented. In one system implementation, the delta-sigma modulator practicing the invention is incorporated into a communications circuitry, which includes an isolation barrier.

Figure 9:
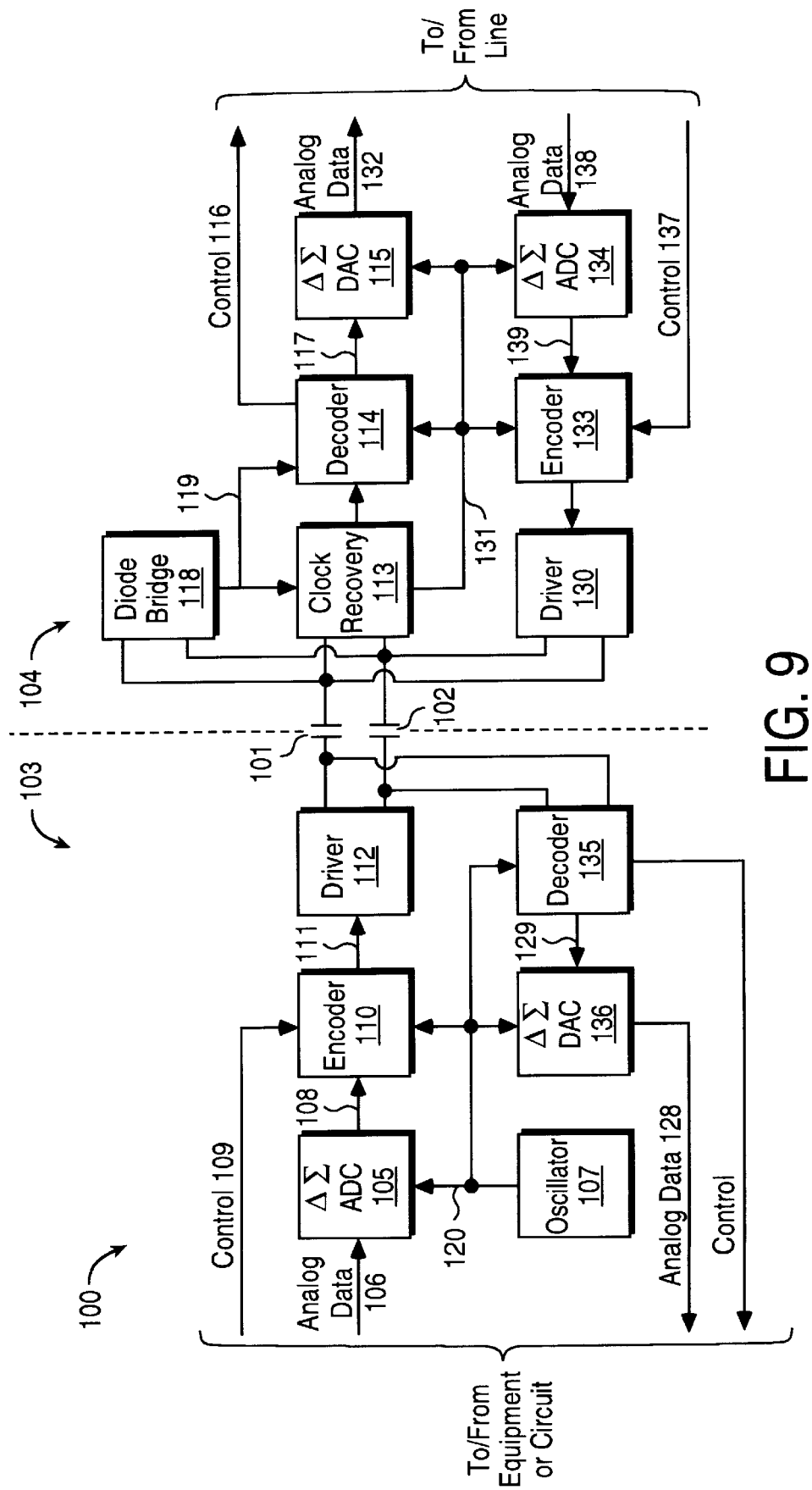
FIG. 9 is a block diagram of an example of an isolation system which incorporates the delta-sigma modulator of the present invention in its analog-to-digital converter.

Referring to FIG. 9, a capacitive isolation system 100, which includes a delta-sigma analog to digital converter implementing the present invention, is shown. The system 100 shown is a bidirectional system allowing data transfer in either direction. In the illustrated example, the capacitive isolation system is separated into a powered side or section 103 (shown to the left of the center dotted line) and a line side or section 104 (shown to the right of the center dotted line). The two sections are separated by the isolation barrier comprised of two high voltage capacitors 101 and 102. Note that the terms "powered" and "line" distinguish the side of the barrier containing AC powered circuitry and the side which is coupled to the communication line, which must be isolated from the powered circuitry or equipment. Isolation of this sort is used in a communication system, such as when AC powered circuitry or equipment is isolated from circuitry interfaced to a telephone line.

The powered section 103 includes a delta-sigma analog-to-digital converter 105 operable on the analog input 106 and synchronized to a clock signal 120 from an oscillator 107. The analog input 106 of the powered section is an analog signal containing information to be transferred across the isolation barrier, which may be for example an analog voice signal to be coupled to a telephone system. Digital output 108 of the delta-sigma ADC 105 may be time-division multiplexed with digital control input 109 by the encoder circuit 110. Digital control input 109 is a digital signal containing additional information to be transferred across the isolation barrier capacitors 101 and 102. The digital control input 109 may include control information for analog circuitry on the line side of the isolation barrier. The encoder circuit 110 also formats the resulting data stream into a coding scheme that allows for robust clock recovery on the line side of the isolation barrier. The encoder circuit 110 also receives the clock signal 120 from the oscillator 107. A driver circuit 112 of the powered section drives the encoded signal to the isolation capacitors 101 and 102 in response to the output 111 of the encoder circuit 110.

In one embodiment, capacitor 101 is driven bidirectionally by drivers 112 and 130 while capacitor 102 provides a return path across the isolation barrier. In another embodiment, capacitors 101 and 102 are differentially driven by digital driver circuits 112 and 130.

An embodiment of the line section, shown to the right of the isolation capacitors includes a clock recovery circuit 113, whose inputs are coupled to the isolation capacitors 101 and 102. The clock recovery circuit 113 recovers a clock signal from the digital data driven across the isolation barrier and provides synchronized clock signal 131 to the various circuits in the line section 104. The recovered clock operates as the time base for a decoder 114 and a delta-sigma digital-to-analog converter 115. The decoder 114 separates the time division multiplexed data and control information, providing digital control output 116 to other circuitry, as well as providing a synchronous data signal 117 as an input to the delta-sigma DAC 115.

The delta-sigma DAC 115, with digital input 117 supplied by the decoder 114, and clock signal 131 supplied by clock recovery unit 113, operates synchronously with the delta-sigma ADC 105 and provides an analog output 132. An active diode bridge 118 is coupled to the isolation capacitors 101 and 102 and supplies a DC power supply voltage to the clock recovery circuit 113 and the decoder 114 by drawing current from the digital signal transferred across the isolation barrier. The driver 130 remains tri-stated until the decoder 114 has detected a valid frame, indicating successful power-up of the line section circuitry.

The embodiment shown in FIG. 9 also enables communication from the line side 104 to the powered side 103, or from right to left across the isolation capacitors as illustrated. An encoder circuit 133 and the driver circuit 130 cooperate to communicate information back from the line side to a decoder circuit 135 in the powered section 103. The encoder 133 receives a clock input 131 from the clock recovery unit 113 and is thereby synchronized to the oscillator 107 and encoder 110. This synchronization allows information transfer in each direction to occur in distinct time slots. In time slots where the driver 112 is operable to transfer information from the powered side 103 to the line side 104, the driver 130 is tri-stated or disabled. Alternatively, in time slots where the line side driver 130 is operable to transfer information back from the line side 104 to the powered side 103, the driver 112 is tri-stated or disabled. In this manner, bidirectional communication may be established across a single pair of high voltage isolation capacitors 101 and 102.

Digital control input 137 of the line section 104 is a digital signal containing information to be communicated across the isolation barrier, including control information for analog circuitry on the powered side of the barrier. The line section 104 also includes a delta-sigma ADC 134 operable on an analog input signal 138, so that the information contained in the analog signal 138 can be conveyed across the barrier in digital form and then accurately reproduced on the powered side 103 of the barrier. The delta-sigma ADC 134 receives its clock input from the clock recovery circuit 113, and is thereby synchronized with the oscillator 107. The digital output signal 139 generated by the ADC 134 may be time-division multiplexed with the digital control input 137 in the encoder 133.

On the powered side 103, the decoder circuit 135 is coupled to the isolation capacitors 101 and 102 to receive signals therefrom and identify signals representing information coming from the line side. The decoder 135 then extracts the digital control information from the data stream received from the line side 104, and passes data signal 129 generated by the delta-sigma ADC 134 to a delta-sigma DAC 136.

The decoder 135 also latches and times the data received across the barrier to synchronize it with the clock signal 120, thereby eliminating the effects of phase noise interference and other sources of jitter in the synchronous digital signal. The clock input from the oscillator 107 ensures to synchronize the ADC 134 to DAC 136. The DAC 136 provides a reconstructed analog data output signal 128, thereby completing the communication of analog information transfer across the isolation barrier.

In summary, FIG. 9 describes a bidirectional communication system for conveying analog and digital information across a capacitive isolation barrier. The barrier itself is inexpensive, since only two high voltage isolation capacitors are required for synchronous, bidirectional communication. The barrier is a reliable communication channel because the digital signals communicated across the barrier are insensitive to amplitude and phase noise interference that may be introduced at the isolation barrier.

The system described above is described in a U.S. Patent Application titled "Isolation System With Digital Communication Across A Capacitive Barrier;" Jeffrey W. Scott et al.; Ser. No. 08/841,409; filed Apr. 22, 1997; which is incorporated by reference herein. It is appreciated that the present invention can be utilized in a DC in general. The ADC can be configured for use in a variety of systems. The solation system described above is but one example.

In respect to the scheme of the present invention, it is implemented in the delta-sigma ADC 134 in FIG. 9. The invention can also be implemented in the delta-sigma ADC 105. Thus, the use of the present invention in a system's environment is described. As noted, the system's environment is described herein as an example of how a delta-sigma analog-to-digital converter of the present invention can be utilized in a system setting.

Thus, an improved technique for detecting and suppressing an overload condition in a delta-sigma modulator for use in an analog-to-digital converter is described. The scheme of the present invention degrades the performance of the modulator by substituting a different coefficient in one or more integrator stages of the modulator. The degraded performance ensures that the overload condition is encountered only when the input signal exceeds the full scale maximum and when the degraded mode is activated, the modulator ensures that a degraded SNR is first noted at the output before full clipping begins.

We claim:

1. An apparatus for degrading an output of an integrator stage of a modulator utilized in an analog-to-digital converter in order to suppress an overload condition comprising:
   a detection unit coupled to detect an onset of an occurrence of the overload condition for the modulator;
   a first circuit coupled to the integrator stage and utilized for providing normal operation of the modulator;
   a second circuit coupled to said integrator stage and utilized only for providing a degraded mode of operation of the modulator;
   a switch coupled to said first and second circuits and to said detection unit for switching in one or the other of the circuits in response to said detection unit, when said detection unit detects an onset of the overload condition, wherein said switch is controlled by the detection unit.

2. The apparatus of claim 1 wherein the integrator stage includes a switched capacitor circuit so that one capacitance value is switched into the switched capacitor circuit when said first circuit is required and a second capacitance value is switched in to the switched capacitor circuit when said second circuit is required.

3. The apparatus of claim 2 wherein a first capacitor and a second capacitor are switched in to the switched capacitor circuit when said first circuit is required and said second capacitor is switched out of the switched capacitor circuit so that only said first capacitor remains in the circuit when said second circuit is required.

4. The apparatus of claim 2 wherein said detection unit is comprised of a counter for counting a bit stream of bits to determine the overload condition.

5. In an analog-to-digital converter, a delta-sigma modulator for converting an analog signal to a digital signal in which the modulator operates under a normal mode until an onset of an overload condition is detected whereupon the modulator operates under a degraded mode to suppress the overload condition comprising:

a detection unit coupled to detect an onset of an occurrence of the overload condition for the modulator, which is specified as exceeding the peak intended amplitude for an input signal;

a first coefficient value coupled to an integrator stage of the modulator for providing the normal mode of operation of the modulator;

a second coefficient value coupled to the integrator stage for providing the degraded mode of operation of the modulator;

a switch coupled to said first and second coefficient values and said detection unit, said switch for switching in one or the other of the coefficient values in response to said detection unit, wherein said switch is controlled by said detection unit.

6. The modulator of claim 5 wherein the integrator stage includes a switched capacitor circuit so that one capacitance value is switched into the circuit when said first coefficient is required and a second capacitance value is switched in to the circuit when said second coefficient value is required.

7. The modulator of claim 6 wherein a first capacitor and a second capacitor are switched in to the circuit when said first coefficient value is required and said second capacitor is switched out of the circuit so that only said first capacitor remains in the circuit when said second coefficient value is required.

8. The modulator of claim 6 wherein said detection unit is comprised of a counter for counting a bit stream of bits to determine the overload condition.

9. The modulator of claim 8 wherein said detection unit is an up/down counter for counting a bit stream at an output of the modulator.

10. A method of detecting and suppressing an overload condition of a modulator for converting an analog signal to a digital signal, in which the modulator operates under a normal mode until an onset of an overload condition is detected whereupon the modulator operates under a degraded mode to suppress the overload condition, comprising the steps of:

providing a first coefficient value to an integrator stage of the modulator when the modulator is operating under a normal mode of operation;

monitoring for a specified analog input level to the modulator;

detecting when the specified analog input level is detected;

switching in a second coefficient value in place of the first coefficient value to degrade a performance of the modulator to suppress the overload condition when the specified analog input level is detected.

11. The method of claim 10 wherein the step of providing a first coefficient value includes providing a switched capacitor circuit so that one capacitance value is switched in when the first coefficient value is required and the step of switching in the second coefficient value includes switching in a second capacitance value when the second coefficient value is required.

12. The method of claim 11 wherein said steps for providing the first coefficient value and switching in the second coefficient value include providing a first capacitor and a second capacitor when the first coefficient value is required and the second capacitor is switched out of the circuit so that only the first capacitor remains in the circuit when the second coefficient value is required.

13. The method of claim 12 wherein the steps of monitoring and detecting utilizes a counter for counting a bit stream of bits to determine the overload condition.

14. The method of claim 13 further including the step of utilizing an up/down counter for counting a bit stream at an output of the modulator.

15. A communication system, in which a non-AC powered circuitry is coupled to a transmission medium and in which isolation is required between the non-AC powered circuitry and an AC powered circuitry, for receiving an analog signal from one or the other side of the isolation barrier, converting the analog signal to a digital signal and transferring a digital signal across the isolation barrier comprising:

a capacitive barrier coupled to the AC powered circuitry and non-AC powered circuitry for providing isolation between the two circuitry;

an analog-to-digital converter, a delta-sigma modulator for converting an analog signal to a digital signal in which the modulator operates under a normal mode until an onset of an overload condition is detected whereupon the modulator operates under a degraded mode to suppress the overload condition comprising:

(a) a detection unit coupled to detect an onset of an occurrence of the overload condition for the modulator, which is specified as exceeding the peak intended amplitude for an input signal;

(b) a first coefficient value coupled to an integrator stage of the modulator for providing the normal mode of operation of the modulator;

(c) a second coefficient value coupled to the integrator stage for providing the degraded mode of operation of the modulator;

(d) a switch coupled to said first and second coefficient values and said detection unit, said switch for switching in one or the other of the coefficient values in response to said detection unit, wherein the switch is controlled by said detection unit.

16. The communication system of claim 15 wherein the integrator stage includes a switched capacitor circuit so that one capacitance value is switched into the circuit when said first coefficient is required and a second capacitance value is switched in to the circuit when said second coefficient value is required.

17. The communication system of claim 16 wherein a first capacitor and a second capacitor are switched in to the circuit when said first coefficient value is required and said second capacitor is switched out of the circuit so that only said first capacitor remains in the circuit when said second coefficient value is required.

18. The communication system of claim 16 wherein said detection unit is comprised of a counter for counting a bit stream of bits to determine the overload condition.

19. The communication system of claim 18 wherein said detection unit is an up/down counter for counting a bit stream at an output of the modulator.

20. An apparatus for degrading an output of an integrator stage of a modulator utilized in an analog-to-digital converter in order to suppress an overload condition comprising:

a detection unit coupled to detect an onset of an occurrence of the overload condition for the modulator;

a first circuit coupled to the integrator stage and utilized for providing normal operation of the modulator;

a second circuit coupled to said integrator stage and utilized only for providing a degraded mode of operation of the modulator;

a switch coupled to said first circuit and said second circuit and said detection unit, said switch for switching in one or the other of the circuits in response to said detection unit, when said detection unit detects an onset of the overload condition; and a switched capacitor circuit so that one capacitance value is switched into the switched capacitor circuit when said first circuit is required and a second capacitance value is switched in to the switched capacitor circuit when said second circuit is required, wherein a first capacitor and a second capacitor are switched in to the switched capacitor circuit when said first circuit is required and said second capacitor is switched out of the switched capacitor circuit so that only said first capacitor remains in the circuit when said second circuit is required.

21. The apparatus of claim 20 wherein said detection unit is comprised of a counter for counting a bit stream of bits to determine the overload condition.

22. In an analog-to-digital converter, a delta-sigma modulator for converting an analog signal to a digital signal in which the modulator operates under a normal mode until an onset of an overload condition is detected whereupon the modulator operates under a degraded mode to suppress the overload condition comprising:

a detection unit coupled to detect an onset of an occurrence of the overload condition for the modulator, which is specified as exceeding the peak intended amplitude for an input signal;

a first coefficient value coupled to an integrator stage of the modulator for providing the normal mode of operation of the modulator;

a second coefficient value coupled to the integrator stage for providing the degraded mode of operation of the modulator; and a switch coupled to said first and second coefficients and said detection unit, said switch for switching in one or the other of the coefficient values in response to said detection unit, wherein the integrator stage includes a switched capacitor circuit so that one capacitance value is switched into the circuit when said first coefficient is required and a second capacitance value is switched in to the circuit when said second coefficient value is required, and wherein a first capacitor and a second capacitor are switched in to the circuit when said first coefficient value is required and said second capacitor is switched out of the circuit so that only said first capacitor remains in the circuit when said second coefficient value is required.

23. The modulator of claim 22 wherein said detection unit is comprised of a counter for counting a bit stream of bits to determine the overload condition.

24. The modulator of claim 23 wherein said detection unit is an up/down counter for counting a bit stream at an output of the modulator.

25. A method of detecting and suppressing an overload condition of a modulator for converting an analog signal to a digital signal, in which the modulator operates under a normal mode until an onset of an overload condition is detected whereupon the modulator operates under a degraded mode to suppress the overload condition, comprising the steps of:

providing a first coefficient value to an integrator stage of the modulator when the modulator is operating under a normal mode of operation by providing a switched capacitor circuit so that one capacitance value is switched in when the first coefficient value is required;

monitoring for a specified analog input level to the modulator;

detecting when the specified analog input level is detected;

switching in a second coefficient value in place of the first coefficient value to degrade a performance of the modulator to suppress the overload condition by switching in a second capacitance value when the second coefficient value is required; and wherein the steps for providing the first coefficient value and switching in the second coefficient value include providing a first capacitor and a second capacitor when the first coefficient value is required and the second capacitor is switched out of the circuit so that only the first capacitor remains in the circuit when the second coefficient value is required.

26. The method of claim 25 wherein the steps of monitoring and detecting utilizes a counter for counting a bit stream of bits to determine the overload condition.

27. The method of claim 26 further including the step of utilizing an up/down counter for counting a bit stream at an output of the modulator.

28. A communication system, in which a non-AC powered circuitry is coupled to a transmission medium and in which isolation is required between the non-AC powered circuitry and an AC powered circuitry, for receiving an analog signal from one or the other side of the isolation barrier, converting the analog signal to a digital signal and transferring a digital signal across the isolation barrier comprising:

a capacitive barrier coupled to the AC powered circuitry and non-AC powered circuitry for providing isolation between the two circuitry;

an analog-to-digital converter, a delta-sigma modulator for converting an analog signal to a digital signal in which the modulator operates under a normal mode until an onset of an overload condition is detected whereupon the modulator operates under a degraded mode to suppress the overload condition comprising:

(a) a detection unit coupled to detect an onset of an occurrence of the overload condition for the modulator, which is specified as exceeding the peak intended amplitude for an input signal;

(b) a first coefficient value coupled to an integrator stage of the modulator for providing the normal mode of operation of the modulator;

(c) a second coefficient value coupled to the integrator stage for providing the degraded mode of operation of the modulator; and (d) a switch coupled to said first and second coefficient values and said detection unit, said switch for switching in one or the other of the coefficient values in response to said detection unit, wherein the integrator stage includes a switched capacitor circuit so that one capacitance value is switched into the circuit when said first coefficient is required and a second capacitance value is switched in to the circuit when said second coefficient value is required, and wherein a first capacitor and a second capacitor are switched in to the circuit when said first coefficient value is required and said second capacitor is switched out of the circuit so that only said first capacitor remains in the circuit when said second coefficient value is required.

29. The communication system of claim 28 wherein said detection unit is comprised of a counter for counting a bit stream of bits to determine the overload condition.

30. The communication system of claim 29 wherein said detection unit is an up/down counter for counting a bit stream at an output of the modulator.

* * * * *